United States Patent
Hao et al.

(10) Patent No.: US 12,289,915 B2
(45) Date of Patent: Apr. 29, 2025

(54) SEMICONDUCTOR STRUCTURE

(71) Applicant: INNOSCIENCE (ZHUHAI) TECHNOLOGY CO., LTD., Zhuhai (CN)

(72) Inventors: Ronghui Hao, Zhuhai (CN); King Yuen Wong, Zhuhai (CN)

(73) Assignee: INNOSCIENCE (ZHUHAI) TECHNOLOGY CO., LTD., Zhuhai (CN)

( * ) Notice: Subject to any disclaimer, the term of this patent is extended or adjusted under 35 U.S.C. 154(b) by 0 days.

(21) Appl. No.: 18/664,222

(22) Filed: May 14, 2024

(65) Prior Publication Data

US 2024/0304686 A1 Sep. 12, 2024

Related U.S. Application Data

(62) Division of application No. 17/046,793, filed as application No. PCT/CN2020/102173 on Jul. 15, 2020, now Pat. No. 12,021,124.

(51) Int. Cl.
*H10D 64/23* (2025.01)
*H10D 62/824* (2025.01)
*H10D 62/85* (2025.01)
*H10D 64/01* (2025.01)
*H10D 64/62* (2025.01)

(52) U.S. Cl.
CPC ......... *H10D 64/256* (2025.01); *H10D 62/824* (2025.01); *H10D 62/85* (2025.01); *H10D 62/8503* (2025.01); *H10D 64/01* (2025.01); *H10D 64/62* (2025.01)

(58) Field of Classification Search
CPC ........... H01L 29/41766; H01L 29/2003; H01L 29/452; H10D 64/256; H10D 62/8503; H10D 64/62
See application file for complete search history.

(56) References Cited

U.S. PATENT DOCUMENTS

| 2005/0087763 | A1* | 4/2005 | Kanda | H01L 29/41766 257/192 |
| 2016/0380119 | A1 | 12/2016 | Jung et al. | |
| 2019/0326404 | A1* | 10/2019 | Kumazaki | H01L 29/41766 |

FOREIGN PATENT DOCUMENTS

| CN | 108231911 | 6/2018 |
| CN | 109449197 | 3/2019 |

OTHER PUBLICATIONS

ISA State Intellectual Property Office of the People's Republic of China, International Search Report Issued in Application No. PCT/CN2020/102173, Apr. 15, 2021, WIPO, 2 pages.

(Continued)

*Primary Examiner* — Peter M Albrecht
(74) *Attorney, Agent, or Firm* — JCIPRNET

(57) ABSTRACT

A semiconductor structures and methods for manufacturing the same are provided. The semiconductor structure includes a substrate; a first nitride semiconductor layer disposed on the substrate; a second nitride semiconductor layer disposed on the first nitride semiconductor layer and having a bandgap greater than that of the first nitride semiconductor layer, the second nitride semiconductor layer forming a first recess and a second recess; and an electrode disposed on the second nitride semiconductor layer and comprising an element; wherein the electrode is disposed in the first recess and the second recess.

5 Claims, 11 Drawing Sheets

(56) References Cited

OTHER PUBLICATIONS

ISA State Intellectual Property Office of the People's Republic of China, Written Opinion of the International Searching Authority Issued in Application No. PCT/CN2020/102173, Apr. 15, 2021, WIPO, 3 pages.
State Intellectual Property Office of the People's Republic of China, Office Action and Search Report Issued in Application No. 2020800018259, Apr. 19, 2023, 9 pages. (Submitted with Machine/Partial Translation).
Chung, J.W. etc. "AlGaN/GaN HEMT With 300-GHz fmax," IEEE Electron Device Letters, Mar. 2010, 4 pages.
Hyung-Seok Lee, etc."AlGaN/GaN High-Electron-Mobility Transistors Fabricated Through a Au-Free Technology" "IEEE Electron Device Letters, vol. 32, No. 5, May 2011" 3 pages.
Liang Wang etc. "Dislocation-induced nonuniform interfacial reactions of Ti/Al/Mo/Au ohmic contacts on AlGaN/GaN heterostructure" "Applied Physics Letters 87, 141915 2005" 4 pages.
Lu Yang etc. "High RF Performance AlGaNGaN HEMT Fabricated by Recess-Arrayed Ohmic Contact Technology" ": DOI 10.1109/LED.2018.2828860, IEEE Electron Device Letters" 4 pages.
Romualdo A. Ferreyra. Member etc. "n ++ GaN Regrowth Technique Using Pico-Second Laser Ablation to Form Non-Alloy Ohmic Contacts" "DOI 10.1109/LED.2017.2721951, IEEE Electron Device Letters" 3 pages.
Chwan-Ying Lee etc. "Novel of Normally-off GaN HEMT Device Structure by Using Nano-rods Technology" "CS Mantech Conference, Apr. 23-26, 2012, Boston, Massachusetts, USA" 5 pages.

\* cited by examiner

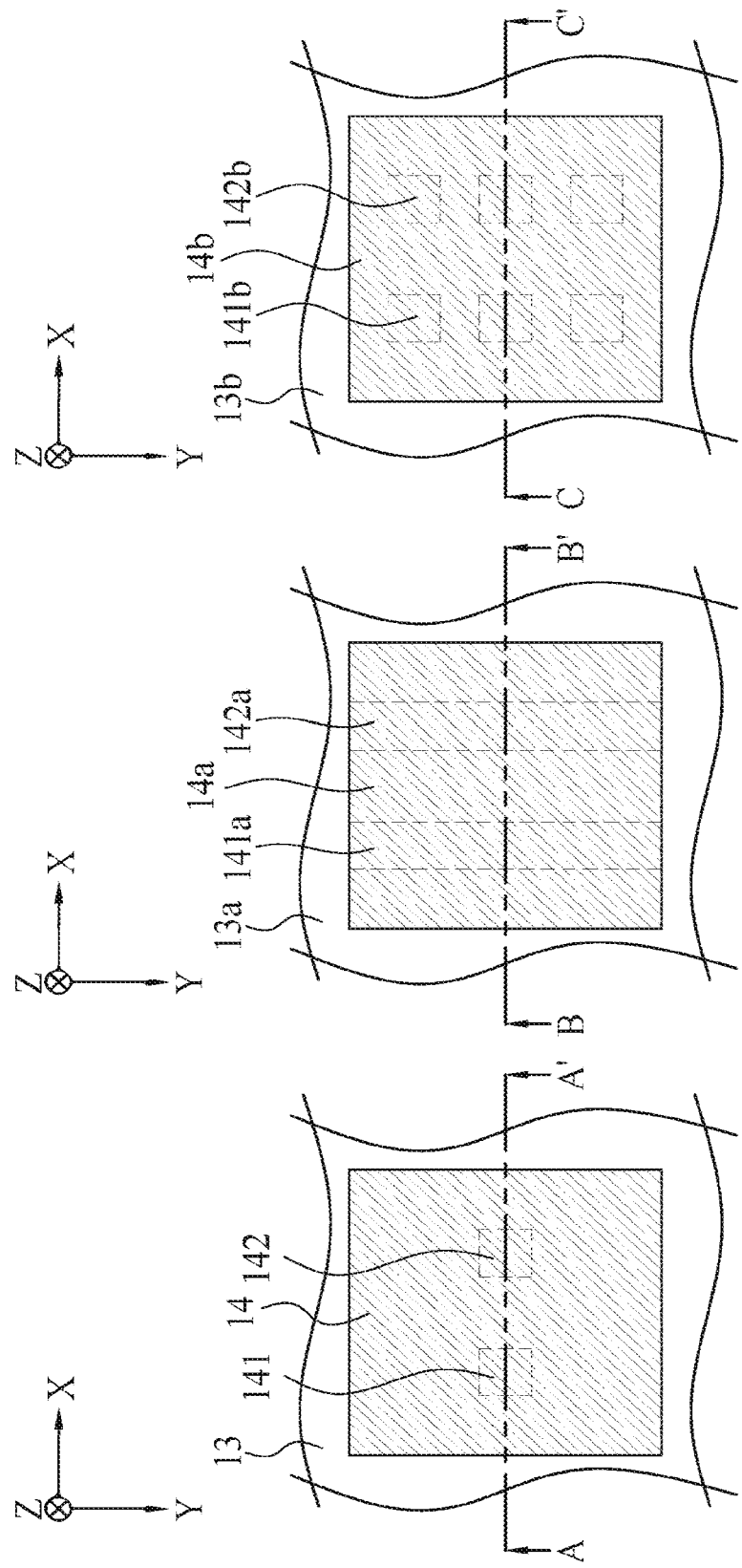

SEMICONDUCTOR STRUCTURE

CROSS-REFERENCE TO RELATED APPLICATIONS

This application is a divisional application of U.S. patent application Ser. No. 17/046,793, filed on Oct. 11, 2020, which is a national stage of International Application No. PCT/CN2020/102173, filed on Jul. 15, 2020. All of the aforementioned patent applications are hereby incorporated by reference in their entireties.

BACKGROUND

1. Technical Field

The present disclosure relates to a semiconductor structure and more particularly to a semiconductor structure with a nano-array structure formed under an electrode.

2. Description of the Related Art

Components including direct bandgap semiconductors, for example, semiconductor components including group III-V materials or group III-V compounds (Category: III-V compounds) can operate or work under a variety of conditions or in a variety of environments (e.g., at different voltages and frequencies).

The semiconductor devices may include a diode, a heterojunction bipolar transistor (HBT), a heterojunction field effect transistor (HFET), a high-electron-mobility transistor (HEMT), a modulation-doped FET (MODFET) and the like.

SUMMARY

According to some embodiments of the present disclosure, a semiconductor structure includes a substrate; a first nitride semiconductor layer disposed on the substrate; a second nitride semiconductor layer disposed on the first nitride semiconductor layer and having a bandgap greater than that of the first nitride semiconductor layer, the second nitride semiconductor layer forming a first recess and a second recess; and an electrode disposed on the second nitride semiconductor layer and including an element; wherein the electrode is disposed in the first recess and the second recess.

According to some embodiments of the present disclosure, a method of manufacturing a semiconductor structure includes: providing a substrate; forming a nitride semiconductor layer on the substrate; removing a portion of the nitride semiconductor layer to form a first recess and a second recess; and filling the first recess and the second recess with conductive material.

According to some embodiments of the present disclosure, a semiconductor structure includes: a substrate; a nitride semiconductor layer disposed on the substrate; and an electrode disposed on the nitride semiconductor layer and including an element, the electrode including a first protrusion and a second protrusion extending into the nitride semiconductor layer, wherein the first protrusion has a first side and a second side opposite the first side, and the second protrusion has a first side and a second side opposite the first side, wherein the nitride semiconductor layer includes a first dislocation adjacent to the first side of the first protrusion and a second dislocation adjacent to the first side of the second protrusion, wherein the first dislocation includes a first portion adjacent to the first side of the first protrusion and a second portion away from the first side of the first protrusion, and the first portion of the first dislocation includes the element of the electrode, and wherein the second dislocation includes a first portion adjacent to the first side of the second protrusion and a second portion away from the first side of the second protrusion, and the first portion of the second dislocation includes the element of the electrode.

According to some embodiments of the present disclosure, a semiconductor structure incudes: a substrate; a first nitride semiconductor layer disposed on the substrate; a second nitride semiconductor layer disposed on the first nitride semiconductor layer and having a bandgap greater than that of the first nitride semiconductor layer, the second nitride semiconductor layer including a first protrusion and a second protrusion; and an electrode disposed on the second nitride semiconductor layer and including an element; wherein the electrode surrounds the first protrusion and the second protrusion.

According to some embodiments of the present disclosure, a method of manufacturing a semiconductor structure includes: providing a substrate; forming a nitride semiconductor layer on the substrate; removing a portion of the nitride semiconductor layer to form a first protrusion and a second protrusion; and providing an electrode over the nitride semiconductor layer and surrounding the first protrusion and the second protrusion.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

FIG. 1A illustrates a top view of a semiconductor structure in accordance with some embodiments of the present disclosure;

FIG. 1B illustrates a top view of another semiconductor structure in accordance with some embodiments of the present disclosure;

FIG. 1C illustrates a top view of another semiconductor structure in accordance with some embodiments of the present disclosure;

Figure 2A:
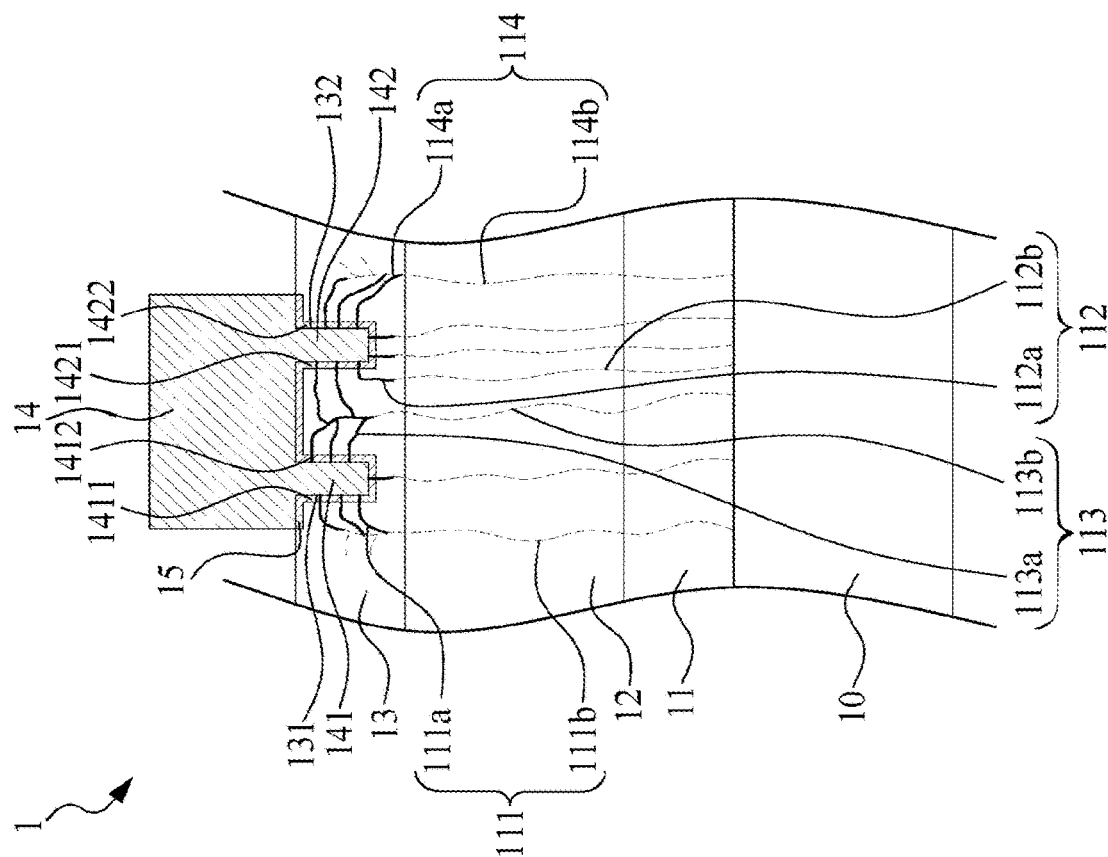
FIG. 2A illustrates a cross-sectional view of the semiconductor structure across line AA' as shown in FIG. 1A.

Common reference numerals are used throughout the drawings and the detailed description to indicate the same or similar components. The present disclosure will be more apparent from the following detailed description taken in conjunction with the accompanying drawings.

DETAILED DESCRIPTION

The following disclosure provides many different embodiments, or examples, for implementing different features of the provided subject matter. Specific examples of components and arrangements are described below. These are, of course, merely examples and are not intended to be limiting. In the present disclosure, reference to the formation or disposal of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail as follows. It should be appreciated, however, that the present disclosure provides many applicable concepts that can be embodied in a wide variety of specific contexts. The specific embodiments discussed are merely illustrative and do not limit the scope of the disclosure.

As to the III-V materials HEMT device, it has the advantages of high operating temperature, high conversion efficiency, high operating frequency, small system volume, etc., and has a variety of applications. The ohmic contact resistance of its source and drain will affect the performance parameters such as on-resistance, transconductance, and conduction loss of the III-V materials HEMT device, which will affect the operating frequency, operating temperature, and conversion efficiency of the entire operating system. Therefore, the III-V materials HEMT device needs a contact resistance as small as possible.

The present disclosure provides a semiconductor structure including a nano-array structure formed under an electrode. In addition, the nano-array structure can provide a larger surface area and higher surface defects density so that the barrier between a nitride semiconductor layer and the electrode is reduced. As a result, the semiconductor structure can have a lower resistance value of its ohmic contact. The semiconductor structure of the present disclosure can be applied in, but is not limited to, diodes, high electron mobility transistor devices (HEMT devices) and the other electronic component with ohmic contact.

FIG. 1A illustrates a top view of a semiconductor structure 1 in accordance with some embodiments of the present disclosure.

Referring to FIG. 1A, the semiconductor structure 1 can include a semiconductor layer 13 and an electrode 14 on the semiconductor layer 13. The electrode 14 may have a protrusion 141 extending along the direction Z into the semiconductor layer 13. The electrode 14 may have a protrusion 142 extending along the direction Z into the semiconductor layer 13. The protrusion 141 may include, for example, but is not limited to, a pillar shape, a column shape, a post shape, and the like. The protrusion 142 may include, for example, but is not limited to, a pillar shape, a column shape, a post shape, and the like. The protrusion 141 and the protrusion 142 can have substantially same or similar appearance. The protrusion 141 and the protrusion 142 have different appearances. The protrusion 141 and the protrusion 142 can be symmetrically arranged as shown in FIG. 1A. Although it is not illustrated in FIG. 1A, however, it is contemplated that the protrusion 141 and the protrusion 142 may be arranged asymmetrically in some other embodiments of the present disclosure.

FIG. 1B illustrates a top view of a semiconductor structure 1a in accordance with some embodiments of the present disclosure.

Referring to FIG. 1B, the semiconductor structure 1a can include a semiconductor layer 13a and an electrode 14a on the semiconductor layer 13a. The electrode 14a may have an elongated protrusion 141a. The electrode 14a may have an elongated protrusion 142a. The protrusion 141a extends along the direction Z into the semiconductor layer 13a. The protrusion 142a extends along the direction Z into the semiconductor layer 13a. The protrusions 141a and 142a may have different sizes or dimensions. The protrusions 141a and 142a may have different depths or thicknesses. The protrusions 141a and 142a may have different shapes or profiles. Although two protrusions 141a and 142a are illustrated in FIG. 1B, however, it is contemplated that the electrode 14a can include more or less protrusion(s). The protrusion 141a and the protrusion 142a can have substantially same or similar appearance. The protrusion 141a and the protrusion 142a can have different appearances.

FIG. 1C illustrates a top view of a semiconductor structure 1b in accordance with some embodiments of the present disclosure.

Referring to FIG. 1C, the electrode 14b may two columns of protrusions. The left column has three protrusions 141b. The right column has three protrusions 142b. The electrode 14b may have a protrusion 141b extending along the direction Z into the semiconductor layer 13. The electrode 14b may have a protrusion 142b extending along the direction Z into the semiconductor layer 13. The protrusion 141b may include, for example, but is not limited to, a pillar shape, a column shape, a post shape, and the like. The protrusion 142b may include, for example, but is not limited to, a pillar shape, a column shape, a post shape, and the like. The protrusion 141b and the protrusion 142b can have substantially same or similar appearance. The protrusion 141b and the protrusion 142b have different appearances. The protrusions 141b and the protrusions 142b can be symmetrically arranged as shown in FIG. 1C. Although it is not illustrated in FIG. 1C, however, it is contemplated that the protrusions 141b and the protrusion 142b may be arranged asymmetrically in some other embodiments of the present disclosure. The protrusions 141b and 142b may have different sizes or dimensions. The protrusions 141b and 142b may have different depths or thicknesses. The protrusions 141b and 142b may have different shapes or profiles. Although six protrusions 141b and 142b are illustrated in FIG. 1C, however, it is contemplated that the electrode 14b can include more or less protrusion(s).

FIG. 2A illustrates a cross-sectional view of the semiconductor structure 1 across line A-A' as shown in FIG. 1A. The cross-sectional view of the semiconductor structure 1a across line B-B' as shown in FIG. 1B, and the cross-sectional view of the semiconductor structure 1b across line C-C' as shown in FIG. 1C are the same as the structure shown in FIG. 2A.

Referring to FIG. 2A, a semiconductor structure 1 may include a substrate 10, a buffer layer 11, a semiconductor layer 12, a semiconductor layer 13, an electrode 14, and an interlayer 15.

The substrate 10 may include, without limitation, silicon (Si), doped Si, silicon carbide (SiC), germanium silicide (SiGe), gallium arsenide (GaAs), or other semiconductor materials. The substrate 10 may include, without limitation, sapphire, silicon on insulator (SOI), or other suitable materials.

The buffer layer 11 may be disposed on the substrate 10. The buffer layer 11 may be disposed on the substrate 10. The buffer layer 11 may include nitrides. The buffer layer 11 may include, for example, but is not limited to, aluminum nitride (AlN). The buffer layer 11 may include, for example, but is not limited to, aluminum gallium nitride (AlGaN). The buffer layer 11 may include a multilayer structure.

The semiconductor layer 12 may be disposed on the substrate 10. The semiconductor layer 12 may be disposed on the buffer layer 11. The semiconductor layer 12 may include a group III-V material. The semiconductor layer 12 may include, for example, but is not limited to, group III nitride. The semiconductor layer 12 may include, for example, but is not limited to, GaN. The semiconductor layer 12 may include, for example, but is not limited to, AlN. The semiconductor layer 12 may include, for example, but is not limited to, InN. The semiconductor layer 12 may include, for example, but is not limited to, compound $In_xAl_yGa_{1-x-y}N$, where x+y≤1. The semiconductor layer 12 may include, for example, but is not limited to, compound $Al_yGa_{(1-y)}N$, where y≤1.

The semiconductor layer 13 may be disposed on the semiconductor layer 12. The semiconductor layer 13 may include a group III-V material. The semiconductor layer 13 may include, for example, but is not limited to, group III nitride. The semiconductor layer 13 may include, for example, but is not limited to, compound $Al_yGa_{(1-y)}N$, where y≤1. The semiconductor layer 13 may include, for example, but is not limited to, GaN. The semiconductor layer 13 may include, for example, but is not limited to, AlN. The semiconductor layer 13 may include, for example, but is not limited to, InN. The semiconductor layer 13 may include, for example, but is not limited to, compound $In_xAl_yGa_{1-x-y}N$, where x+y≤1.

A heterojunction may be formed between the semiconductor layer 13 and the semiconductor layer 12. The semiconductor layer 13 may have a greater band gap than the semiconductor layer 12. For example, the semiconductor layer 13 may include AlGaN that may have a band gap of about 4.0 eV, and the semiconductor layer 12 may include GaN that may have a band gap of about 3.4 eV. Because the band gap of the semiconductor layer 12 is less than the band gap of the semiconductor layer 13, two dimensional electron gas (2DEG) may be formed in the semiconductor layer 12.

The semiconductor layer 13 may have a recess 131 and a recess 132. A depth of the recess 131 may range from approximately 1 nm to approximately 30 nm. A depth of the recess 132 may range from approximately 1 nm to approximately 30 nm. The recess 131 may include a pillar shape, a trench shape, a column shape, a post shape, and the like. The recess 132 may include a pillar shape, a trench shape, a column shape, a post shape, and the like. The recess 131 and the recess 132 may have substantially the same appearance. The recess 131 and the recess 132 may have different appearances. A diameter of the recess 131 may range from approximately 1 nm to approximately 1 μm. A diameter of the recess 132 may range from approximately 1 nm to approximately 1 μm.

The recess 131 may be created by using an photo mask for dry-etching the semiconductor layer 13 or with other suitable techniques. The recess 132 may be created by using an photo mask for dry-etching the semiconductor layer 13 or with other suitable techniques.

The electrode 14 may be disposed on the semiconductor layer 13. The electrode 14 may include an element. The electrode 14 may be disposed in the recess 131 and the recess 132. Semiconductor structure 1 further includes a doped semiconductor layer (not shown in the figure) on the semiconductor layer 13, and the electrode 14 may be disposed on the doped semiconductor layer so that the doped semiconductor layer is located between the semiconductor layer 13 and the electrode 14. The electrode 14 may include a comb or comb-like structure. The element of the electrode 14 may be titanium (Ti). The element of the electrode 14 may be tantalum (Ta). The element of the electrode 14 may be tungsten (W). The element of the electrode 14 may be aluminum (Al). The element of the electrode 14 may be cobalt (Co). The element of the electrode 14 may be copper (Cu). The element of the electrode 14 may be nickel (Ni). The element of the electrode 14 may be gold (Au). The element of the electrode 14 may be platinum (Pt). The element of the electrode 14 may be lead (Pb). The element of the electrode 14 may be molybdenum (Mo). The element of the electrode 14 may include compounds of the one or more metal mentioned above. The electrode 14 may include a multi-layer structure formed with different conductive metals. Based on the terrain of the semiconductor layer 13, the electrode 14 may be formed as a combination of different types of nanostructures, such as nanowires, nanotubes, nanorods, and the like.

The electrode 14 may include a protrusion 141 and a protrusion 142 extending into the semiconductor layer 13. The electrode 14 may include a protrusion 141 and a second protrusion 142 extending into the semiconductor layer 12. The protrusion 141 may have a side 1411 and a side 1412 opposite the side 1411. The protrusion 142 may have a side 1421 and a side 1422 opposite the side 1421.

In the semiconductor structure 1, defects may exist in the buffer layer 11, the semiconductor layer 12, and the semiconductor layer 13. The defects may include, but is not limited to, dislocations, grain boundaries, and surface defects. The semiconductor layer 13 may include a dislocation 111 adjacent to the side 1411 of the protrusion 141. The semiconductor layer 13 may include a dislocation 112 adjacent to the side 1421 of the protrusion 142. The dislocation 111 may include a portion 111a (shown with a solid line in FIG. 2A) adjacent to the side 1411 of the protrusion 141 and a portion 111b (shown with a dotted line in FIG. 2A) away from the side 1411 of the protrusion 141. The portion 111a of the dislocation 111 may include the element of the electrode 14. The dislocation 112 may include a portion 112a adjacent to the side 1421 of the protrusion 142 and a portion 112b away from the side 1421 of the protrusion 142. The portion 112a of the dislocation 112 may include the element of the electrode 14.

The dislocation 111 may extend from the interface between the substrate 10 and the buffer layer 11. The dislocation 111 may further extend from the buffer layer 11 into the semiconductor layer 12. The dislocation 111 may further extend from the semiconductor layer 12 into the semiconductor layer 13. The dislocation 111 may be bent and terminate in the semiconductor layer 13. The dislocation 111 may be bent and terminate at the interface between the semiconductor layer 13 and the electrode 14. The dislocation 111 may be bent and terminate at the interlayer 15. The dislocation 111 may be bent and terminate orthogonally to the interface between the semiconductor layer 13 and the electrode 14. The dislocation 111 may be bent and terminate orthogonally to the surface of the interlayer 15.

The dislocation 112 may extend from the interface between the substrate 10 and the buffer layer 11. The dislocation 112 may further extend from the buffer layer 11 into the semiconductor layer 12. The dislocation 112 may further extend from the semiconductor layer 12 into the semiconductor layer 13. The dislocation 112 may be bent and terminate in the semiconductor layer 13. The dislocation 112 may be bent and terminate at the interface between the semiconductor layer 13 and the electrode 14. The dislocation 112 may be bent and terminate at the interlayer 15. The dislocation 112 may be bent and terminate orthogonally to the interface between the semiconductor layer 13 and the electrode 14. The dislocation 112 may be bent and terminate orthogonally to the surface of the interlayer 15.

The semiconductor layer 13 may include a dislocation 113 adjacent to the side 1412 of the protrusion 141. The dislocation 113 may include a portion 113a adjacent to the side 1412 of the protrusion 141 and a portion 113b away from the side of the protrusion 141. The portion 113a of the dislocation 113 may include the element of the electrode 14.

The dislocation 113 may extend from the interface between the substrate 10 and the buffer layer 11. The dislocation 113 may further extend from the buffer layer 11 into the semiconductor layer 12. The dislocation 113 may further extend from the semiconductor layer 12 into the semiconductor layer 13. The dislocation 113 may be bent and terminate in the semiconductor layer 13. The dislocation 113 may be bent and terminate at the interface between the semiconductor layer 13 and the electrode 14. The dislocation 113 may be bent and terminate at the interlayer 15. The dislocation 113 may be bent and terminate orthogonally to the interface between the semiconductor layer 13 and the electrode 14. The dislocation 113 may be bent and terminate orthogonally to the surface of the interlayer 15.

The semiconductor layer 13 may include a dislocation 114 adjacent to the side 1422 of the protrusion 142. The dislocation 114 may include a portion 114a adjacent to the side 1422 of the protrusion 142 and a portion 114b away from the side 1422 of the protrusion 142. The portion 114a of the dislocation 114 may include the element of the electrode 14.

The dislocation 114 may extend from the interface between the substrate 10 and the buffer layer 11. The dislocation 114 may further extend from the buffer layer 11 into the semiconductor layer 12. The dislocation 114 may further extend from the semiconductor layer 12 into the semiconductor layer 13. The dislocation 114 may be bent and terminate in the semiconductor layer 13. The dislocation 114 may be bent and terminate at the interface between the semiconductor layer 13 and the electrode 14. The dislocation 114 may be bent and terminate at the interlayer 15. The dislocation 114 may be bent and terminate orthogonally to the interface between the semiconductor layer 13 and the electrode 14. The dislocation 114 may be bent and terminate orthogonally to the surface of the interlayer 15.

The protrusion 141 may have a length along direction Z substantially same to the protrusion 142. The protrusion 141 may have a length along direction Z different from the protrusion 142. The protrusion 141 and the protrusion 142 may have substantially the same appearance. The protrusion 141 and the protrusion 142 have different appearances.

The portion 111b of the dislocation 111 may be devoid of the element of the electrode 14. The portion 112b of the dislocation 112 may be devoid of the element of the electrode 14. The portion 113b of the dislocation 113 may be devoid of the element of the electrode 14. The portion 114b of the dislocation 114 may be devoid of the element of the electrode 14.

The interlayer 15 may be disposed between the semiconductor layer 13 and the electrode 14. The interlayer 15 may include the element of the electrode 14. The interlayer 15 may include metal nitride. The metal nitride may include titanium nitride TiN. A concentration of the metal-nitride component in the dislocations ranges from 1E1 to 1E23 cm−3. The interlayer 15 may be formed after a heating operation (such as rapid thermal annealing, RTA). The interlayer 15 may be composed from the element included in the electrode 14 and a nitrogen atom from the semiconductor layer 13. The interlayer 15 may be composed from the element included in the electrode 14 and a nitrogen atom from the semiconductor layer 12.

The aforementioned semiconductor structure 1 has the advantages of increasing the contact surface area between the electrode 14 and the semiconductor layer 13, contributing to an increase of the surface defects (such as N vacancies) of the semiconductor layer 13. In addition, the dislocations 111-114 may have more elements diffused from the electrode 14, for example, but is not limited to, Ti atoms of a multi-layer electrode with Ti/Al/Ni/Au. Thus, the barrier of the semiconductor layer 13 may be lower and the semiconductor structure 1 may have a lower resistance values of its ohmic contact due to the elements of the electrode 14 diffusing into the dislocations 111-114.

Furthermore, by forming a plurality of recesses on the semiconductor layer 13, the area of the interface between the semiconductor layer 13 and the electrode 14 increases. Therefore, the resistance values of the ohmic contact between the semiconductor layer 13 and the electrode 14 is further reduced.

Figure 2B:
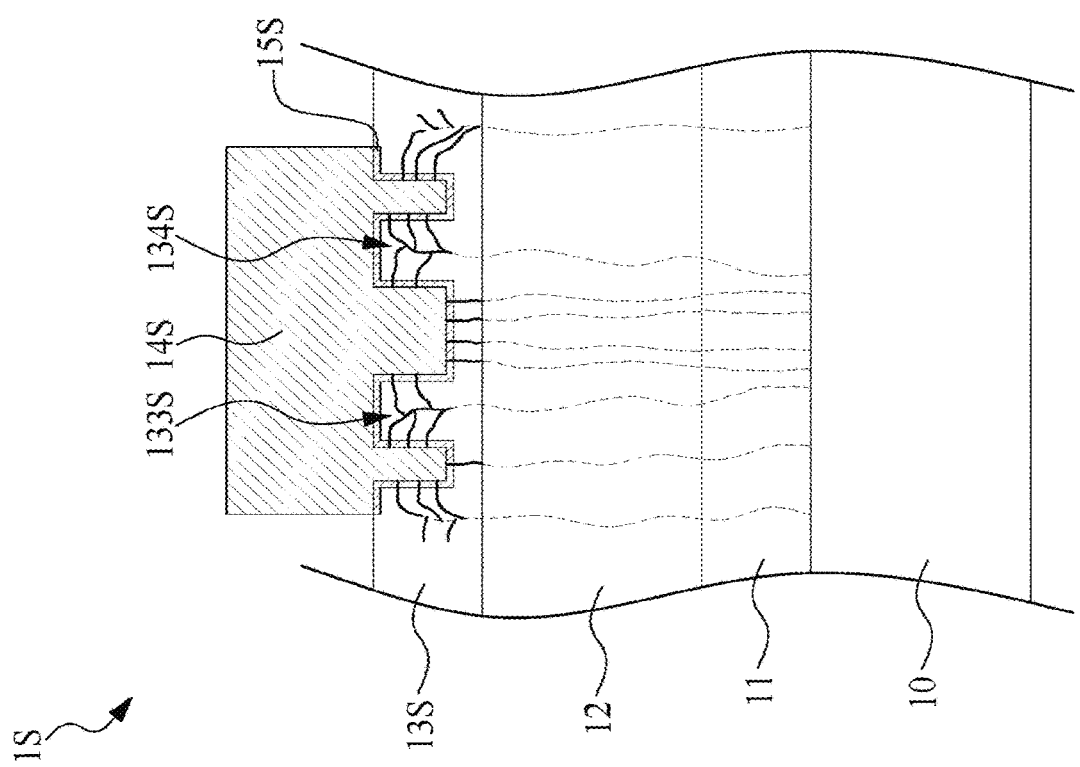
FIG. 2B illustrates a cross-sectional view of the semiconductor structure in accordance with some other embodiments of the present disclosure.

FIG. 2B illustrates a cross-sectional view of the semiconductor structure in accordance with some other embodiments of the present disclosure.

Referring to FIG. 2B, a semiconductor structure 1S may include a substrate 10, a buffer layer 11, a semiconductor layer 12, a semiconductor layer 13S, an electrode 14S, and an interlayer 15S.

As the structure of the semiconductor structure 1S is similar to that of semiconductor structure 1 shown in FIG. 2A, except that the semiconductor layer 13S has protrusions 133S and 134S on it instead of recesses. The electrode 14S may form over the semiconductor layer 13S. The electrode 14S may surround the protrusion 133S. The electrode 14S may surround the protrusion 134S. The electrode 14S may encircle the protrusion 133S. The electrode 14S may encircle the protrusion 134S.

The height of the protrusion 133S may range from approximately 1 nm to approximately 30 nm. The height of the protrusion 134S may range from approximately 1 nm to approximately 30 nm. The protrusion 133S may be a pillar shape, a column shape, a post shape, and the like. The protrusion 134S may include a pillar shape, a column shape, a post shape, and the like. The protrusion 133S and the protrusion 134S may have substantially same appearance. The protrusion 133S and the protrusion 134S may have different appearances.

A diameter of the protrusion 133S may have a ranges from approximately 1 nm to approximately 1 μm. A diameter of the protrusion 134S may have a ranges from approximately 1 nm to approximately 1 μm. The diameter of the protrusion may be very small such that it may create a relative large surface area and surface defects to lower the barrier between the semiconductor layer 13S and the electrode 14S and thus lower the electrical resistance value of the ohmic contact and improve the device efficiency.

The interlayer 15S may be formed between the semiconductor layer 13S and the electrode 14S. The interlayer 15S may include the element of the electrode 14S. The interlayer 15S may include metal nitride. The metal nitride may include titanium nitride TiN. A concentration of the metal-nitride component in the dislocations ranges from 1E1 to 1E23 cm−3. The interlayer 15S may be formed after a heating operation (such as rapid thermal annealing, RTA). The interlayer 15S may be composed from the element included in the electrode 14S and a nitrogen atom from the semiconductor layer 13S. The interlayer 15 may be composed from the element included in the electrode 14S and a nitrogen atom from the semiconductor layer 12.

The aforementioned semiconductor structure 1S has the advantages of increasing the contact surface area between the electrode 14S and the semiconductor layer 13S, contributing to an increase of the surface defects (such as N vacancies) of the semiconductor layer 13S. In addition, the dislocations (shown as dotted lines) may have more elements diffused from the electrode 14S, for example, but is not limited to, Ti atoms of a multi-layer electrode with Ti/Al/Ni/Au. Thus, the barrier of the semiconductor layer 13S may be lower and the semiconductor structure 1S may have a lower resistance values of its ohmic contact due to the elements of the electrode 14S diffusing into the dislocations.

Figure 2C:
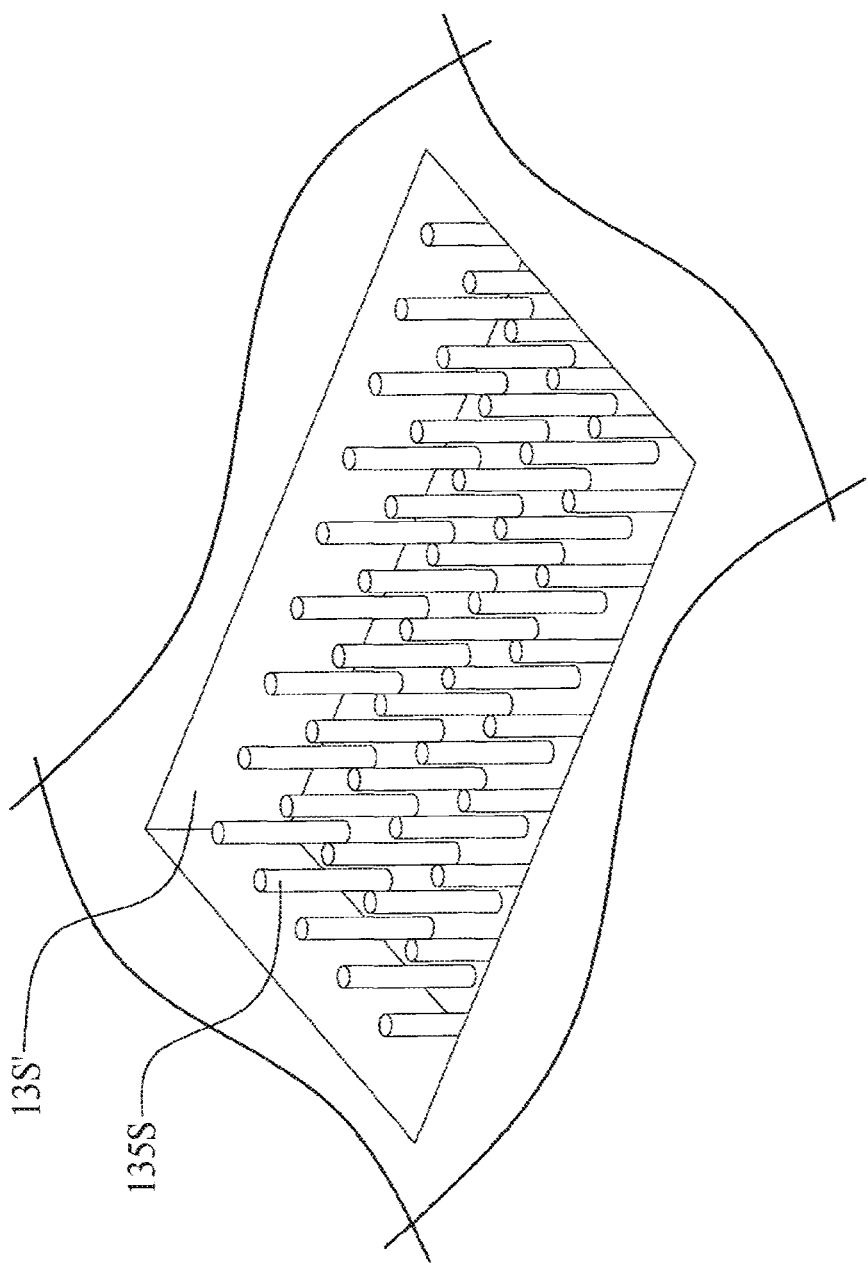
FIG. 2C illustrates a schematic diagram of the nano-array structure of the semiconductor layer in accordance with some embodiments of the present disclosure.

FIG. 2C illustrates a schematic diagram of the nano-array semiconductor structure of the semiconductor layer 13S' in accordance with some embodiments of the present disclosure.

Referring to FIG. 2C, the semiconductor layer 13S' includes the nano-array semiconductor structure. The nano-array semiconductor structure may include plurality of protrusions 135S. A diameter of the protrusions 135S may have a ranges from approximately 1 nm to approximately 1 μm. The number of rows and the number of columns of the nano-array is not limited to those depicted in FIG. 2C.

The protrusions 135S may be made into nano-rods, nano-tubes, nano-wires, nano-fibers, nano-pillars, nano-columns, nano-posts, or the combination thereof. The nano-array semiconductor structure may be formed symmetrically. The nano-array semiconductor structure may be formed asymmetrically.

The nano-array semiconductor structure provides a larger surface area and higher surface defects density so that the barrier between a semiconductor layer 13S' and the electrode over the semiconductor layer 13S' is reduced. As a result, a lower resistance value of its ohmic contact may be obtained.

Figure 3B:
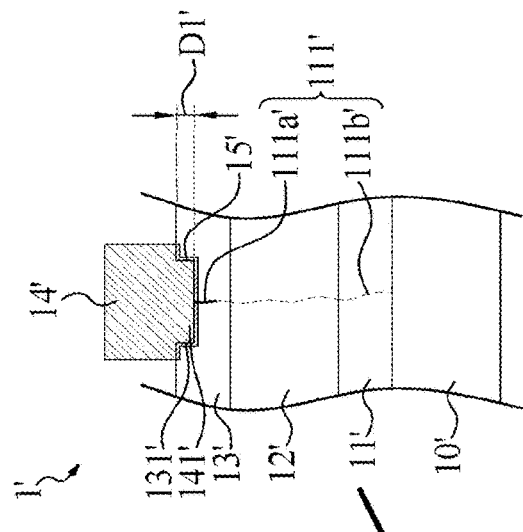
FIG. 3B illustrates a cross-sectional view of a semiconductor structure of a die at the edge of the wafer in accordance with some other embodiments of the present disclosure.
Figure 3C:
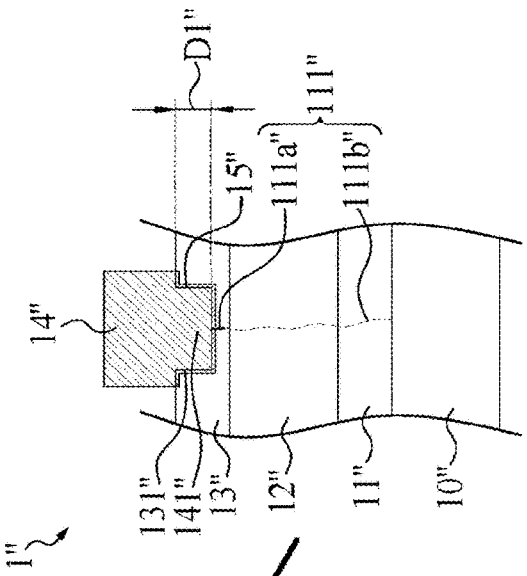
FIG. 3C illustrates a cross-sectional view of a semiconductor structure of a die at the center of the wafer in accordance with some other embodiments of the present disclosure.
Figure 3A:
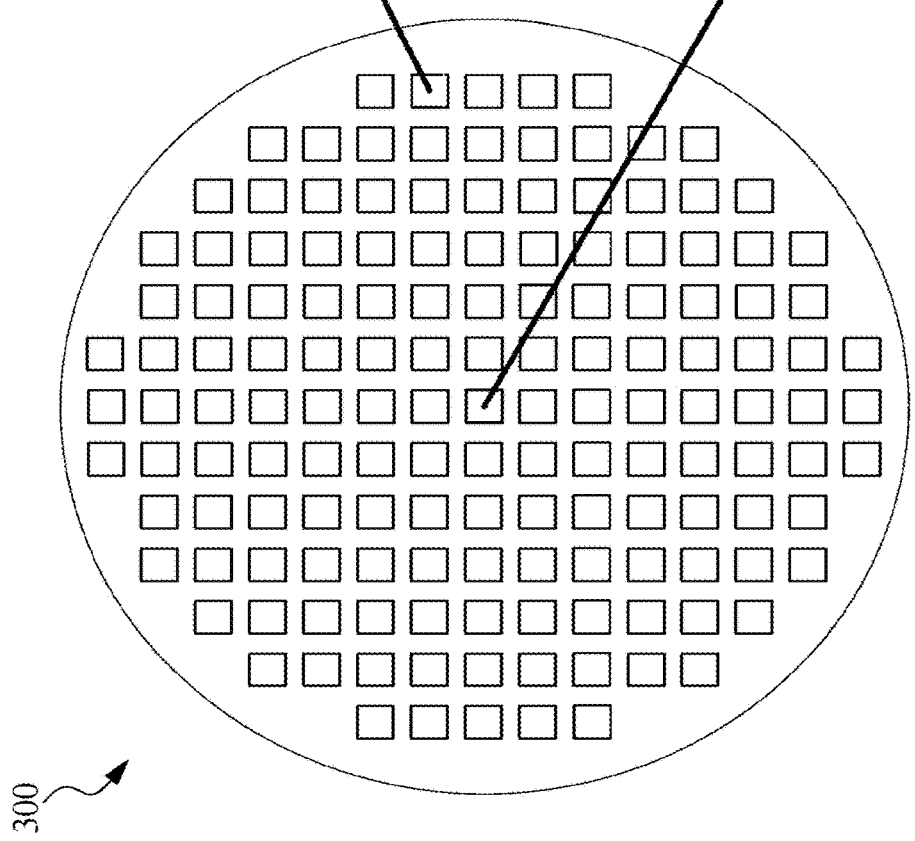
FIG. 3A illustrates a top view of a wafer in accordance with some other embodiments of the present disclosure.

FIG. 3A illustrates a top view of a wafer 300 in accordance with some other embodiments of the present disclosure. The wafer 300 can include semiconductor structures 1' and 1".

FIG. 3B illustrates a cross-sectional view of a semiconductor structure 1' of a die at or close to the edge of the wafer 300 as shown in FIG. 3A. The semiconductor structure 1' can include a die or unit disposed at or adjacent to the periphery of the wafer 300 as shown in FIG. 3A. The semiconductor structure 1' may include a substrate 10', a buffer layer 11', a semiconductor layer 12', a semiconductor layer 13', an electrode 14', and an interlayer 15'. Merely a single recess 131' is defined in the semiconductor layer 13' to accommodate or receive the electrode 14'. In other words, the electrode 14' may include a relatively thin or short protrusion into the semiconductor layer 13'.

FIG. 3C illustrates a cross-sectional view of a semiconductor structure 1" of a die at or adjacent to the center of the wafer 300 in accordance with some other embodiments of the present disclosure. The semiconductor structure 1" may include a substrate 10", a buffer layer 11", a semiconductor layer 12", a semiconductor layer 13", an electrode 14", and an interlayer 15". Merely a single recess 131" is defined or formed in the semiconductor layer 13" to accommodate or receive the electrode 14'. In other words, the electrode 14" may include a relatively thick or long protrusion into the semiconductor layer 13".

While an etching technique is applied to the wafer 300, the etching rate can be greater at or adjacent the center of the wafer 300. In other words, the etching rate can be relatively less at or adjacent to the periphery of the wafer 300. The aforesaid phenomenon may result in the electrode 14' as shown in FIG. 3B. The aforesaid phenomenon may result in the electrode 14" as shown in FIG. 3C.

The depth D1' of the protrusion 141' of the electrode 14' shown in FIG. 3B is less than the depth D1" of the protrusion 141" of the electrode 14" shown in FIG. 3C. Thus, the thickness of the semiconductor layer 13' under protrusion 141' is larger than that of the semiconductor layer 13" under protrusion 141". As a result, the resistance value of the ohmic contact of the electrode 14' can be different from that of the electrode 14". In other words, the semiconductor structure 1' and semiconductor structure 1" have different characteristics or parameters. Accordingly, the units or dies of the wafer 300 may not have a stable performance.

The semiconductor structures 1' and 1", which have only one protrusion, do not have a nano-array structure formed in the semiconductor layer under the electrode. The nano-array structure provides a larger surface area and higher surface defects density so that the barrier between a semiconductor layer and the electrode is reduced. As a result, the semiconductor structures 1' and 1" have a relatively higher resistance value of its ohmic contact.

Figure 4A:
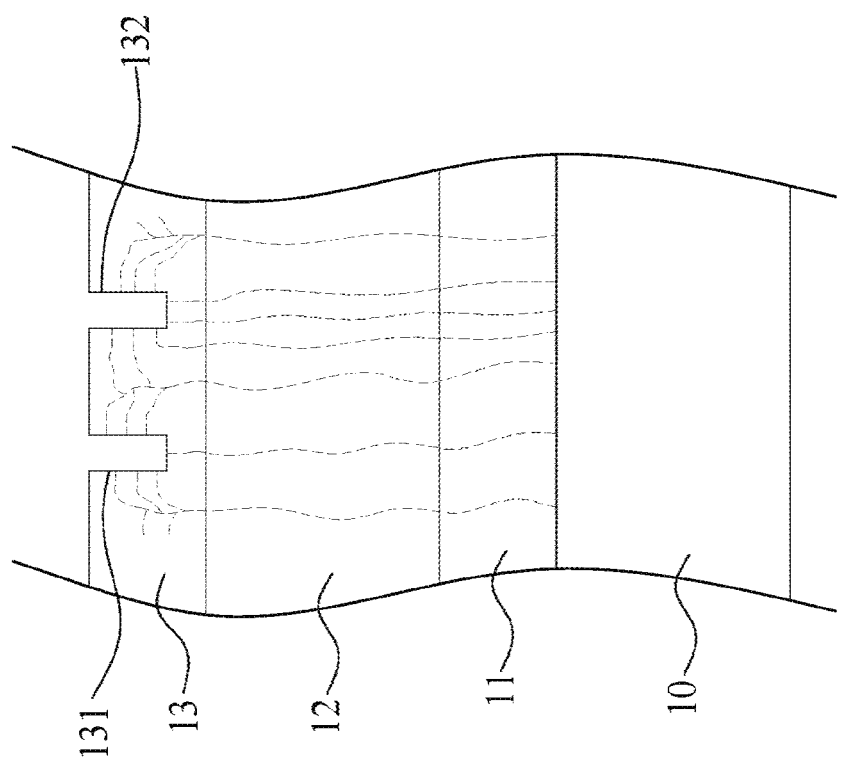
FIG. 4A, FIG. 4B, and FIG. 4C illustrate various stages of a method for manufacturing a semiconductor structure in accordance with some embodiments of the present disclosure.
Figure 4B:
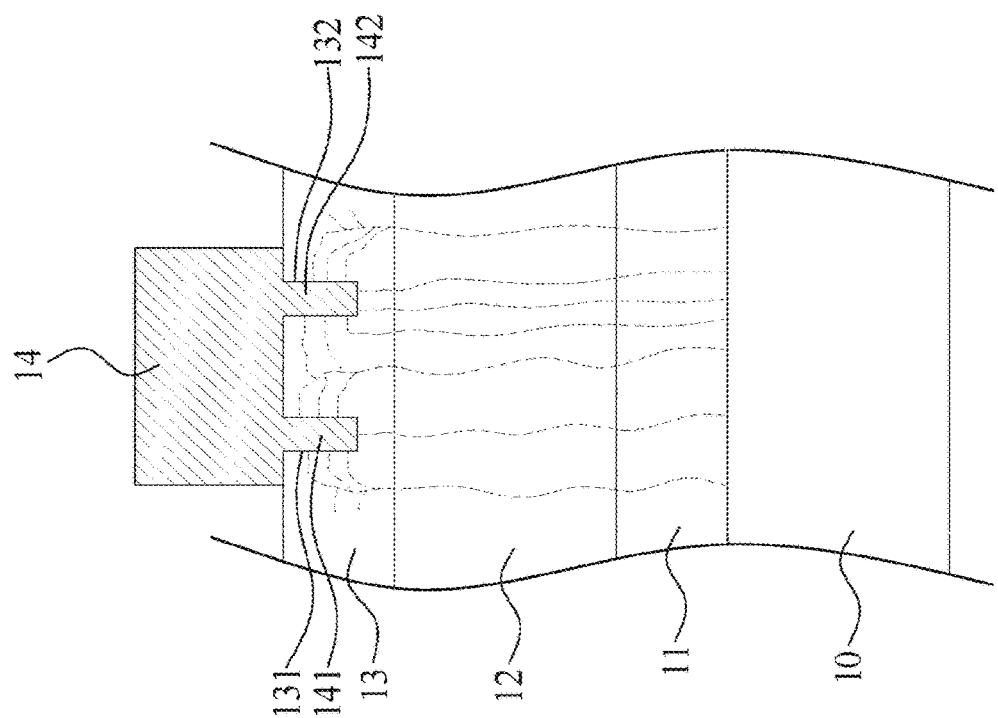
Figure 4C:
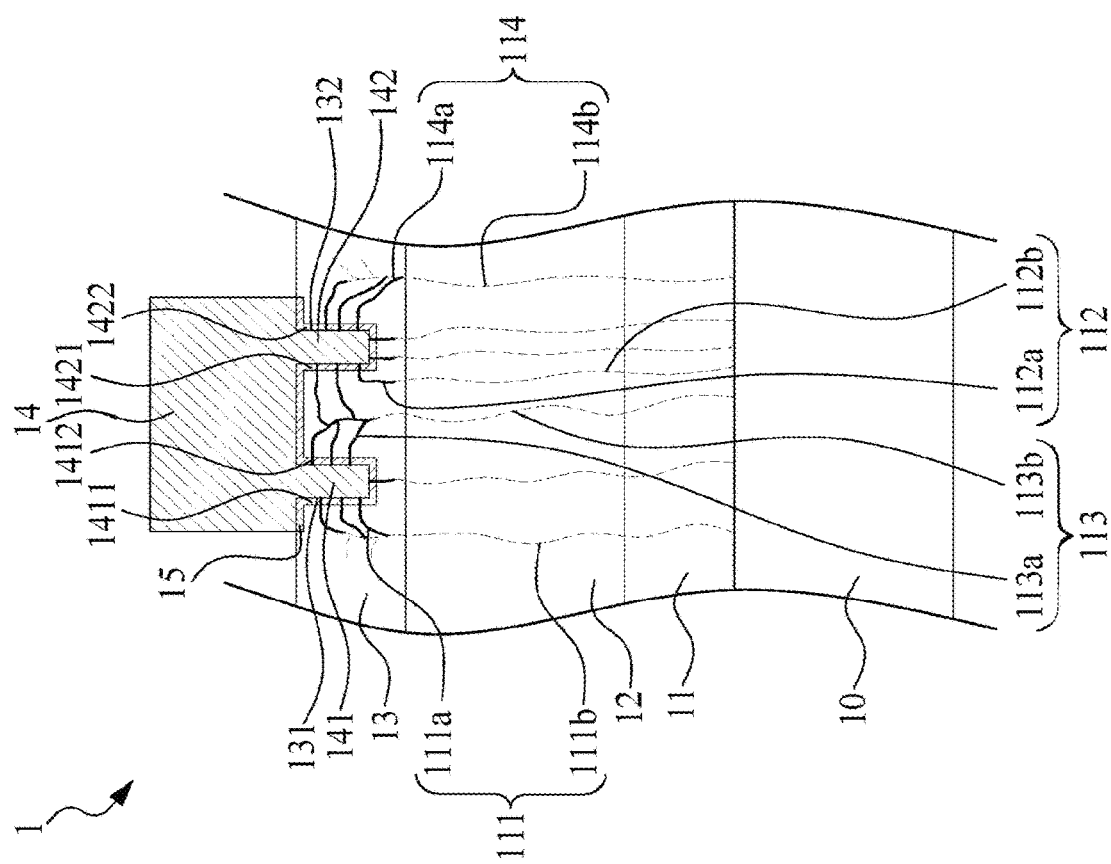

FIG. 4A, FIG. 4B, and FIG. 4C illustrate various stages of a method for manufacturing a semiconductor structure in accordance with some embodiments of the present disclosure.

As shown in FIG. 4A, a substrate 10 is provided. Next, a buffer layer 11, a semiconductor layer 12, and a semiconductor layer 13, are formed on the substrate 10 in sequence. The semiconductor layer 13 is located on the semiconductor layer 12. The buffer layer 11, the semiconductor layer 12, and the semiconductor layer 13 may be, for example, in epitaxial growth via metal organic chemical vapor deposition (MOCVD) or formed via other suitable deposition techniques.

After the semiconductor layer 13 is formed, a portion of the semiconductor layer 13 is removed to form a recess 131 and a recess 132. The recess 131 may be created by using an photo mask for dry-etching the semiconductor layer 13 or with other suitable techniques. The recess 132 may be created by using an photo mask for dry-etching the semiconductor layer 13 or with other suitable techniques.

In addition, the dislocations (shown as the dotted lines) may extend from the interface between the substrate 10 and the buffer layer 11. The dislocations may further extend from the buffer layer 11 into the semiconductor layer 12. The dislocations may further extend from the semiconductor layer 12 into the semiconductor layer 13. The dislocations may be bent and terminate in the semiconductor layer 13. The dislocations may be bent and terminate at the interface between the semiconductor layer 13 and the electrode 14. The dislocations may be bent and terminate at the interlayer 15 (shown in FIG. 4C). The dislocations may be bent and terminate orthogonally to the interface between the semiconductor layer 13 and the electrode 14. The dislocations may be bent and terminate orthogonally to the surface of the interlayer 15 (shown in FIG. 4C).

Referring to FIG. 4B, after the recess 131 and the recess 132 are formed, a conductive material may be filled into the recesses 131 and 132 by the deposition techniques such as CVD, PVD, and electroplating. A electrode with a multi-layer structure may be formed by depositing different conductive material in sequence. After the material is filled into the recesses 131 and 132, the deposited material is etched again through a photomask to form a required electrode structure, so as to form an electrode 14 and the electrode 14 is in contact with the semiconductor layer 13. The electrode 14 may be formed by sputtering, physical vapor deposition, or other suitable processes.

A depth of the recess 131 may range from approximately 1 nm to approximately 30 nm. A depth of the recess 132 may range from approximately 1 nm to approximately 30 nm. The recess 131 may include a pillar shape, a trench shape, a column shape, a post shape, and the like. The recess 132 may include a pillar shape, a trench shape, a column shape, a post shape, and the like. The recess 131 and the recess 132 may have substantially same appearance. The recess 131 and the recess 132 may have different appearances.

Referring to FIG. 4C, after forming the electrode 14, a heating operation is performed on the semiconductor structure 1.

During the heating operation, an interlayer 15 may be formed between the semiconductor layer 13 and the electrode 14. The interlayer 15 may be metal nitride. The interlayer 15 may be titanium nitride (TiN).

During the heating operation, the element of the electrode 14 may diffuse toward the semiconductor layer 13. The element of the protrusion 141 of the electrode 14 may diffuse toward the semiconductor layer 13. The element of the protrusion 142 of the electrode 14 may diffuse toward the semiconductor layer 13. The Ti atoms of a multi-layer electrode with Ti/Al/Ni/Au may diffuse toward the semiconductor layer 13. In addition, during the heating operation, the element of the electrode 14, for example, but is not limited to, Ti atoms of a multi-layer electrode with Ti/Al/Ni/Au, may diffuse into the dislocation 111. During the heating operation, the element of the electrode 14, for example, but is not limited to, Ti atoms of a multi-layer electrode with Ti/Al/Ni/Au, may diffuse into the dislocation 112. During the heating operation, the element of the electrode 14, for example, but is not limited to, Ti atoms of a multi-layer electrode with Ti/Al/Ni/Au, may diffuse into the dislocation 113. During the heating operation, the element of the electrode 14, for example, but is not limited to, Ti atoms of a multi-layer electrode with Ti/Al/Ni/Au, may diffuse into the dislocation 114.

During the heating operation, the nitrogen atom in the semiconductor layer 13 may diffuse into the dislocation 111 and combine with the element of the electrode 14, for example, but it not limited to, Ti atoms of a multi-layer electrode with Ti/Al/Ni/Au, to form the interlayer 15 and leave a region with high electron concentration in the semiconductor layer 13. During the heating operation, the nitrogen atom in the semiconductor layer 13 may diffuse into the dislocation 112 and combine with the element of the electrode 14, for example, but it not limited to, Ti atoms of a multi-layer electrode with Ti/Al/Ni/Au, to form the interlayer 15 and leave a region with high electron concentration in the semiconductor layer 13. During the heating operation, the nitrogen atom in the semiconductor layer 13 may diffuse into the dislocation 113 and combine with the element of the electrode 14, for example, but it not limited to, Ti atoms of a multi-layer electrode with Ti/Al/Ni/Au, to form the interlayer 15 and leave a region with high electron concentration in the semiconductor layer 13. During the heating operation, the nitrogen atom in the semiconductor layer 13 may diffuse into the dislocation 114 and combine with the element of the electrode 14, for example, but it not limited to, Ti atoms of a multi-layer electrode with Ti/Al/Ni/Au, to form the interlayer 15 and leave a region with high electron concentration in the semiconductor layer 13.

During the heating operation, the nitrogen atom in the semiconductor layer 13 may diffuse into a portion 111a (shown as the solid line in FIG. 4C) of the dislocation 111 and combine with the element of the electrode 14, for example, but it not limited to, Ti atoms of a multi-layer electrode with Ti/Al/Ni/Au, to form the interlayer 15 and leave a region with high electron concentration in the semiconductor layer 13. During the heating operation, the nitrogen atom in the semiconductor layer 13 may diffuse into a portion 112a (shown as the solid line in FIG. 4C) of the dislocation 112 and combine with the element of the electrode 14, for example, but it not limited to, Ti atoms of a multi-layer electrode with Ti/Al/Ni/Au, to form the interlayer 15 and leave a region with high electron concentration in the semiconductor layer 13. During the heating operation, the nitrogen atom in the semiconductor layer 13 may diffuse into a portion 113a (shown as the solid line in FIG. 4C) of the dislocation 113 and combine with the element of the electrode 14, for example, but it not limited to, Ti atoms of a multi-layer electrode with Ti/Al/Ni/Au, to form the interlayer 15 and leave a region with high electron concentration in the semiconductor layer 13. During the heating operation, the nitrogen atom in the semiconductor layer 13 may diffuse into a portion 114a (shown as the solid line in FIG. 4C) of the dislocation 114 and combine with the element of the electrode 14, for example, but it not limited to, Ti atoms of a multi-layer electrode with Ti/Al/Ni/Au, to form the interlayer 15 and leave a region with high electron concentration in the semiconductor layer 13.

Furthermore, due to the heating operation, the nitrogen atom in the semiconductor layer 13 may diffuse into the surface defects along an interface between the semiconductor layer 13 and the electrode 14 to form the interlayer 15, and leave a region with high electron concentration in the semiconductor layer 13. For example, in some cases, a multi-layer electrode with Ti/Al/Ni/Au is provided, after the heating operation, the Ti atoms of the multi-layer electrode can diffuse into the semiconductor layer to capture the nitrogen atom to form a TiN compound along the interface between the semiconductor layer 13 and the multi-layer electrode. As a result, the semiconductor structure 1 can have a lower resistance value of its ohmic contact due to the formation of the interlayer 15 by promoting direct contact between the metal and the 2DEG region.

Figure 5A:
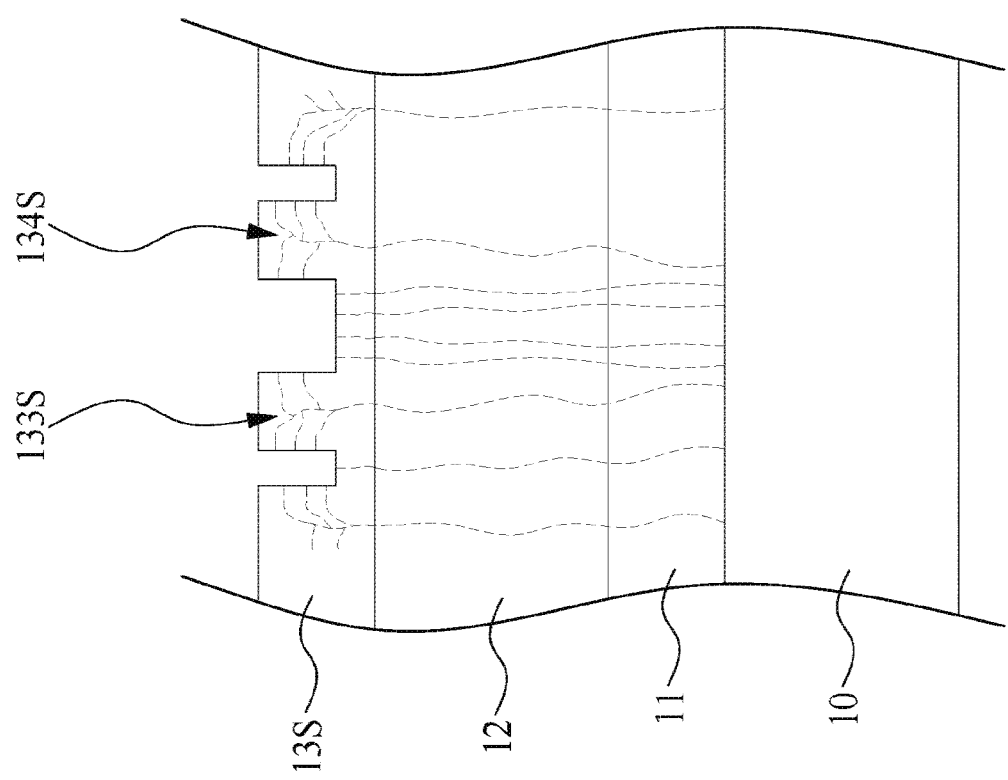
FIG. 5A, FIG. 5B, and FIG. 5C illustrate various stages of a method for manufacturing a semiconductor structure in accordance with some other embodiments of the present disclosure.
Figure 5B:
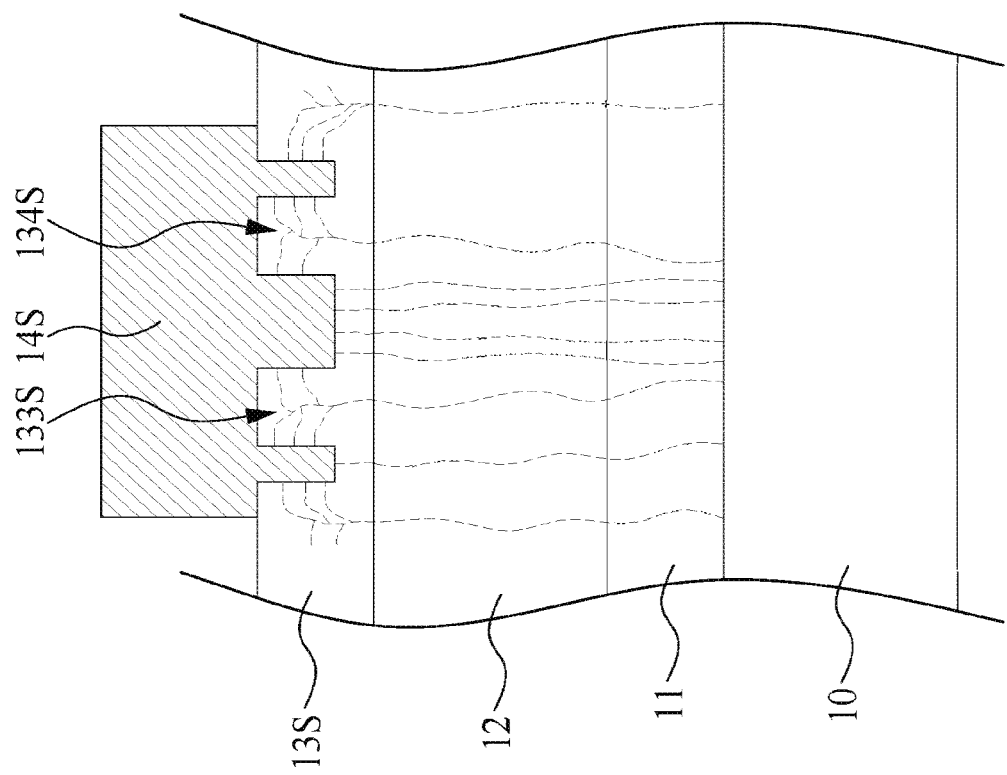
Figure 5C:
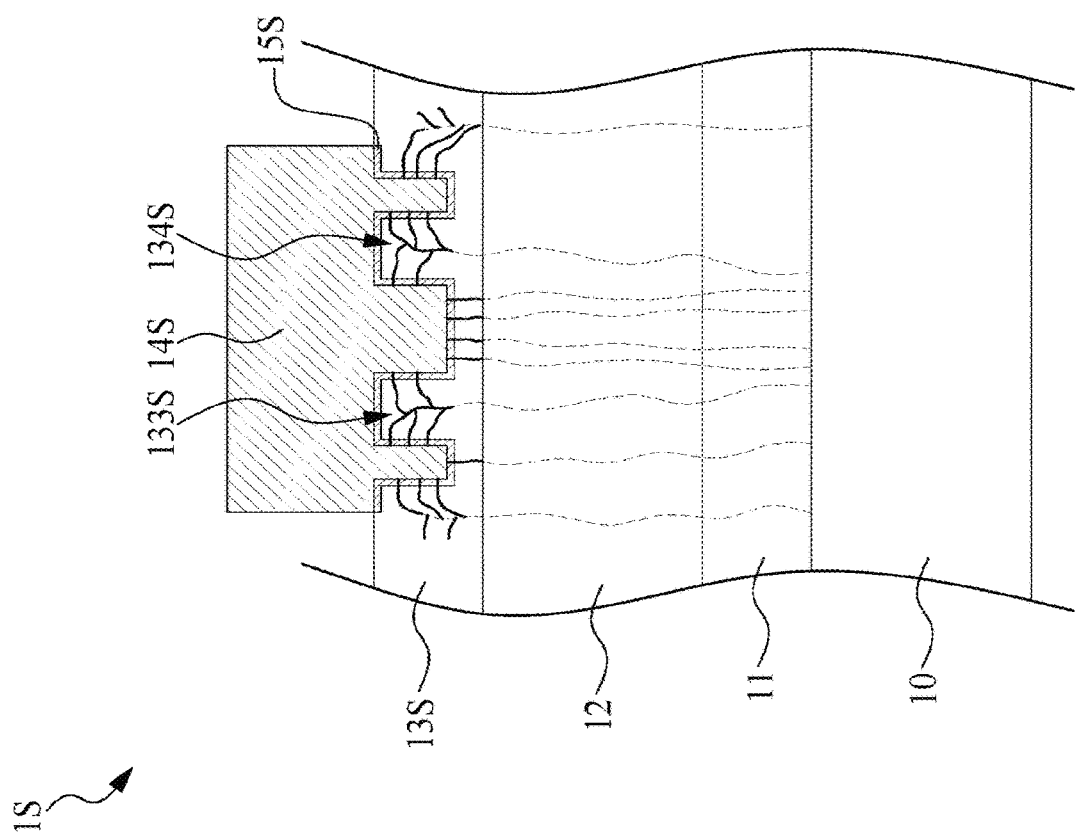

FIG. 5A, FIG. 5B, and FIG. 5C illustrate various stages of a method for manufacturing a semiconductor structure 1S in accordance with some other embodiments of the present disclosure.

As shown in FIG. 5A, a substrate 10 is provided. Next, a buffer layer 11, a semiconductor layer 12, and a semiconductor layer 13S, are formed on the substrate 10 in sequence. The semiconductor layer 13S is located on the semiconductor layer 12. The buffer layer 11, the semiconductor layer 12, and the semiconductor layer 13S may be, for example, in epitaxial growth via metal organic chemical vapor deposition (MOCVD) or formed via other suitable deposition techniques.

After the semiconductor layer 13S is formed, a portion of the semiconductor layer 13S forms as a protrusion 133S and a protrusion 134S. The protrusions 133S and 134S may be created by using a photo mask for dry-etching the semiconductor layer 13S or with other suitable techniques. Due to the small sizes of the protrusions 133S and 134S, an imprint process and transfer technique, which can form nano-structure, are required. For example, nano-sized metal particles may be used as a metal mask for forming the protrusions 133S and 134S with a suitable etching technique.

It is contemplated that the nano-sized metal particles may be formed by annealing a metal layer. The metal layer, for example, but is not limited to, may be a nickel (Ni) layer. The teaching technique may be inductively coupled plasma (ICP) reactive ion etching. The pattern of the nano-sized metal particles may later be transferred into the semiconductor layer 13S and create the protrusions 133S and 134S.

In addition, the dislocations (shown as the dotted lines) may extend from the interface between the substrate 10 and the buffer layer 11. The dislocations may further extend from the buffer layer 11 into the semiconductor layer 12. The dislocations may further extend from the semiconductor layer 12 into the semiconductor layer 13S. The dislocations may be bent and terminate in the semiconductor layer 13S. The dislocations may be bent and terminate at the interface between the semiconductor layer 13S and the electrode 14S. The dislocations may be bent and terminate at the interlayer 15S (shown in FIG. 5C). The dislocations may be bent and terminate orthogonally to the interface between the semiconductor layer 13S and the electrode 14S. The dislocations may be bent and terminate orthogonally to the surface of the interlayer 15S (shown in FIG. 5C).

Referring to FIG. 5B, after the protrusion 133S and a protrusion 134S are formed, an electrode 14S may be formed over the nitride semiconductor layer 13S by the deposition techniques such as CVD, PVD, and electroplating. A electrode with a multi-layer structure may be formed by depositing different conductive material in sequence. The electrode 14S may surround the protrusion 133S. The electrode 14S may surround the protrusion 134S. The electrode 14S may encircle the protrusion 133S. The electrode 14S may encircle the protrusion 134S. The electrode 14S may be formed by sputtering, physical vapor deposition, or other suitable processes.

Referring to FIG. 5C, after forming the electrode 14S, a heating operation is performed on the semiconductor structure 1S.

During the heating operation, an interlayer 15S may be formed between the semiconductor layer 13S and the electrode 14S. The interlayer 15S may be metal nitride. The interlayer 15S may be titanium nitride (TiN).

During the heating operation, the element of the electrode 14S may diffuse toward the semiconductor layer 13S. The Ti atoms of a multi-layer electrode with Ti/Al/Ni/Au may diffuse toward the semiconductor layer 13S. In addition, during the heating operation, the element of the electrode 14S, for example, but is not limited to, Ti atoms of a multi-layer electrode with Ti/Al/Ni/Au, may diffuse into the dislocations. During the heating operation, the element of the electrode 14, for example, but is not limited to, Ti atoms of a multi-layer electrode with Ti/Al/Ni/Au, may diffuse into part of the dislocations (shown as solid lines).

Furthermore, due to the heating operation, the nitrogen atom in the semiconductor layer 13S may diffuse into the surface defects along an interface between the semiconductor layer 13S and the electrode 14S to form the interlayer 15S, and leave a region with high electron concentration in the semiconductor layer 13S. For example, in some cases, a multi-layer electrode with Ti/Al/Ni/Au is provided, after the heating operation, the Ti atoms of the multi-layer electrode can diffuse into the semiconductor layer 13S to capture the nitrogen atom to form a TiN compound along the interface between the semiconductor layer 13S and the multi-layer electrode. As a result, the semiconductor structure 1S can have a lower resistance value of its ohmic contact due to the formation of the interlayer 15 by promoting direct contact between the metal and the 2DEG region.

The present disclosure relates to the semiconductor structures/devices and the manufacturing methods thereof, and more particularly to semiconductor structures/devices with nano-array structure, which has the advantages of increasing the contact surface area between the electrode and the semiconductor layer and thus the barrier between a semiconductor layer and the electrode is reduced. As a result, the present disclosure provides a semiconductor structure with a lower resistance value of its ohmic contact. In addition, the semiconductor structure disclosed herein may not only be used in nitride-based HEMT, but also may be used for other wide band gap semiconductor materials.

As used herein, spatially relative terms, such as "beneath," "below," "lower," "above," "upper," "lower," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 80 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately", "substantially", "substantial" and "about" are used to describe and account for small variations. When used in conduction with an event or circumstance, the terms can refer to instances in which the event of circumstance occurs precisely as well as instances in which the event or circumstance occurs to a close approximation. As used herein with respect to a given value or range, the term "about" generally refers to within ±10%, ±5%, ±1%, or ±0.5% of the given value or range. Ranges can be expressed herein as from one endpoint to another endpoint or between two endpoints. All ranges disclosed herein are inclusive of the endpoints, unless specified otherwise. The term "substantially coplanar" can refer to two surfaces within micrometers (μm) of lying along a same plane, such as within 10 μm, within 5 μm, within 1 μm, or within 0.5 μm of lying along the same plane. When referring to numerical values or characteristics as "substantially" the same, the term can refer to the values lying within ±10%, ±5%, ±1%, or ±0.5% of an average of the values.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A semiconductor structure (1S), comprising:
   a substrate (10);
   a first nitride semiconductor layer (12) disposed on the substrate (10);
   a second nitride semiconductor layer (13S) disposed on the first nitride semiconductor layer (12) and having a bandgap greater than that of the first nitride semiconductor layer (12), the second nitride semiconductor layer (13S) including a first protrusion (133S) and a second protrusion (134S); and
   an electrode (14S) disposed on the second nitride semiconductor layer (13S) and comprising an element;
   wherein the electrode (14S) surrounds the first protrusion (133S) and the second protrusion (134S), wherein a diameter of the first protrusion (133S) ranges from approximately 1 nm to approximately 1 μm.

2. The semiconductor structure of claim 1, wherein a height of the first protrusion (133S) ranges from approximately 1 nm to approximately 30 nm.

3. The semiconductor structure of claim 1, wherein an interlayer (15S) is formed between the second nitride semiconductor layer (13S) and the electrode (14S).

4. The semiconductor structure of claim 1, further comprising a dislocation in the second nitride semiconductor layer (13S), wherein the dislocation comprises the element of the electrode (14S).

5. The semiconductor structure of claim 1, wherein the electrode (14S) comprises a first protrusion and a second protrusion extending into the second nitride semiconductor layer (13S), wherein the first protrusion of the electrode (14S) has a first side and a second side opposite the first side, and the second protrusion of the electrode (14S) has a first side and a second side opposite the first side,
   wherein the first nitride semiconductor layer (12) and the second nitride semiconductor layer (13S) comprise a first dislocation adjacent to the first side of the first protrusion of the electrode (14S) and a second dislocation adjacent to the first side of the second protrusion of the electrode (14S).

* * * * *